United States Patent
Van Der Mast et al.

(10) Patent No.: US 7,349,068 B2
(45) Date of Patent: Mar. 25, 2008

(54) LITHOGRAPHIC APPARATUS AND DEVICE MANUFACTURING METHOD

(75) Inventors: Karel Diederick Van Der Mast, Helmond (NL); Kars Zeger Troost, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 215 days.

(21) Appl. No.: 11/013,939

(22) Filed: Dec. 17, 2004

(65) Prior Publication Data

US 2006/0132742 A1 Jun. 22, 2006

(51) Int. Cl.
G03B 27/42 (2006.01)

(52) U.S. Cl. .................. 355/53; 355/55; 355/67; 355/71

(58) Field of Classification Search .................. 355/55, 355/53, 67, 45–46
See application file for complete search history.

(56) References Cited

U.S. PATENT DOCUMENTS

| | | | | |
|---|---|---|---|---|
| 3,873,189 | A | * | 3/1975 | Whitaker et al. ........... 359/824 |
| 5,229,872 | A | | 7/1993 | Mumola |
| 5,296,891 | A | | 3/1994 | Vogt et al. |
| 5,500,736 | A | | 3/1996 | Koitabashi et al. |
| 5,523,193 | A | | 6/1996 | Nelson |
| 5,530,482 | A | | 6/1996 | Gove et al. |
| 5,579,147 | A | | 11/1996 | Mori et al. |
| 5,617,211 | A | | 4/1997 | Nara et al. |
| 5,677,703 | A | | 10/1997 | Bhuva et al. |
| 5,691,541 | A | | 11/1997 | Ceglio et al. |
| 5,801,811 | A | * | 9/1998 | Lo et al. ...................... 355/22 |
| 5,808,797 | A | | 9/1998 | Bloom et al. |
| 5,973,863 | A | | 10/1999 | Hatasawa et al. |
| 5,982,553 | A | | 11/1999 | Bloom et al. |
| 6,133,986 | A | | 10/2000 | Johnson |
| 6,177,980 | B1 | | 1/2001 | Johnson |
| 6,238,852 | B1 | * | 5/2001 | Klosner ..................... 430/396 |
| 6,425,669 | B1 | | 7/2002 | Kanatake et al. |
| 6,473,237 | B2 | * | 10/2002 | Mei ........................... 359/619 |
| 6,509,955 | B2 | * | 1/2003 | Mei et al. ..................... 355/53 |
| 6,552,775 | B1 | | 4/2003 | Yanagihara et al. |
| 6,556,278 | B1 | | 4/2003 | Tanaka et al. |
| 6,687,041 | B1 | | 2/2004 | Sandstrom |
| 6,747,783 | B1 | | 6/2004 | Sandstrom |
| 6,795,169 | B2 | | 9/2004 | Tanaka et al. |
| 6,806,897 | B2 | | 10/2004 | Kataoka et al. |
| 6,811,953 | B2 | | 11/2004 | Hatada et al. |

(Continued)

FOREIGN PATENT DOCUMENTS

EP 1 109 067 A2 6/2001

(Continued)

OTHER PUBLICATIONS

European Search Report, dated Apr. 19, 2006, for European Patent Application No. 05257490.2, 8 pages.

*Primary Examiner*—D. Rutledge
(74) *Attorney, Agent, or Firm*—Sterne, Kessler, Goldstein & Fox P.L.L.C.

(57) ABSTRACT

A system and method are provided including different moveable lenses within a projection system that can be placed in the path of a radiation beam to change a magnification of the projection system. By changing the magnification of the projection system an area of a substrate exposed per pixel can be adjusted, and a throughput of the system optimized.

12 Claims, 7 Drawing Sheets

U.S. PATENT DOCUMENTS

| | | |
|---|---|---|
| 6,847,461 B1 | 1/2005 | Latypov et al. |
| 6,967,711 B2 * | 11/2005 | Gui .............................. 355/67 |
| 7,095,568 B2 * | 8/2006 | Kobayashi et al. ......... 359/740 |
| 2001/0048515 A1 | 12/2001 | Mei |
| 2002/0006561 A1 | 1/2002 | Taniguchi |
| 2002/0008863 A1 * | 1/2002 | Taniguchi et al. ............. 355/55 |
| 2002/0012858 A1 | 1/2002 | Kawkubo et al. |
| 2003/0011756 A1 * | 1/2003 | Omura et al. .................. 355/71 |
| 2003/0063366 A1 | 4/2003 | Hunt |
| 2003/0206281 A1 * | 11/2003 | Jain ........................... 355/53 |
| 2003/0233528 A1 | 12/2003 | Ishikawa et al. |
| 2004/0041104 A1 | 3/2004 | Liebregts et al. |
| 2004/0130561 A1 | 7/2004 | Jain |
| 2004/0159636 A1 | 8/2004 | Sandstrom et al. |
| 2005/0007572 A1 | 1/2005 | George et al. |
| 2005/0068599 A1 | 3/2005 | Mushika |
| 2005/0168790 A1 | 8/2005 | Latypov et al. |
| 2005/0264782 A1 | 12/2005 | Ryzhikov et al. |
| 2006/0012766 A1 * | 1/2006 | Klosner et al. ................ 355/67 |

FOREIGN PATENT DOCUMENTS

| | | |
|---|---|---|
| EP | 1 482 373 A1 | 12/2004 |
| WO | WO 98/33096 | 7/1998 |
| WO | WO 98/38597 | 9/1998 |

\* cited by examiner

LITHOGRAPHIC APPARATUS AND DEVICE MANUFACTURING METHOD

BACKGROUND

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, can be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). Instead of a mask, the patterning means can comprise an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the beam in a given direction (the "scanning" direction), while synchronously scanning the substrate parallel or anti-parallel to this direction.

The throughput of a lithographic apparatus is controlled by, amongst other things, the area of the substrate exposed per exposure of the apparatus. In a conventional lithographic apparatus, the throughput is determined by the number of exposure fields step-and-scanned over the substrate per unit of time. The exposure field size is determined by the reticle field size divided by the magnification of the projection system, typically 4×, but also, e.g. 5× or 6×.

The throughput of an apparatus comprising an array of individually controllable elements instead of a mask (e.g., a maskless lithographic apparatus) is determined by the number of pixels in the field multiplied by the area exposed per pixel divided by the number of passes used to print each pattern, typically 2 but also 3 or 4 passes are used. A larger number of passes enhances the dose control and smoothes out the non-uniformities induced by the pixel raster. For effective exposure of the substrate the pixel size must be approximately half the size of the minimum feature. Thus, for areas of a substrate in which the minimum feature size is larger than for the minimum feature size overall (i.e., the resolution is lower), the apparatus is not operating at maximum efficiency. Throughput is lower than is possible, leading to decreased revenue.

Therefore, what is needed is a system and method that increases efficiency of a maskless lithography system to increase throughput.

SUMMARY

According to an embodiment of the present invention, there is provided a lithographic apparatus comprising an illumination system, an array of individually controllable elements, and a projection system. The illumination system conditions a radiation beam. The array of individually controllable elements patterns the beam. The projection system projects the patterned beam onto a target portion of a substrate.

In one example, the projection system projects the radiation beam at a plurality of significantly different magnifications.

In one example, a lithographic apparatus transfers a pattern from a patterning device onto a substrate. The lithographic apparatus can project a radiation beam at a plurality of significantly different magnifications.

In one example, the illumination system operates at a plurality of magnifications. In one example, when the magnification of the projection system is changed, the angular magnification of the illumination system is correspondingly changed to ensure that the desired numerical aperture is obtained.

According to one embodiment of the present invention, there is provided a lithographic apparatus comprising an illumination system, an array of individually controllable elements, and a projection system. The illumination system conditions a radiation beam. The array of individually controllable elements pattern the beam. The projection system projects the patterned radiation beam onto a target portion of a substrate at a first magnification. In one example, the projection system projects the patterned radiation beam onto the target portion of the substrate at a second magnification. The second magnification is substantially 1/n, wherein n is any positive integer.

According to one embodiment of the present invention there is provided a device manufacturing method comprising the following steps. Using an array of individually controllable elements to impart a radiation beam with a pattern in its cross-section. Projecting the patterned beam of radiation at a first magnification onto a target portion of the substrate. Projecting the patterned beam of radiation at a second magnification onto a target portion of the substrate. The first magnification is significantly different from the first magnification.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers can indicate identical or functionally similar elements.

DETAILED DESCRIPTION OF THE EMBODIMENTS

Overview and Terminology

Although specific reference can be made in this text to the use of lithographic apparatus in the manufacture of integrated circuits (ICs), it should be understood that the lithographic apparatus described herein can have other applications, such as the manufacture of integrated optical systems, guidance and detection patterns for magnetic domain memories, flat panel displays, thin-film magnetic heads, micro and macro fluidic devices, etc. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (e.g., a tool that typically applies a layer of resist to a substrate and develops the exposed resist) or a metrology or inspection tool. Where applicable, the disclosure herein can be applied to such and other substrate processing tools. Further, the substrate can be processed more than once, for example, in order to create a multi-layer IC, so that the term substrate used herein can also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array can comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation devices. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used. For example, the pattern "displayed" on the array of individually controllable elements can differ substantially from the pattern eventually transferred to a layer of or on the substrate. Similarly, the pattern eventually generated on the substrate can not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Although specific reference can be made in this text to the use of lithographic apparatus in the manufacture of ICs, it should be understood that the lithographic apparatus described herein can have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track (a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g., having a wavelength in the range of 5-20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein can be considered as synonymous with the more general term "projection system."

The illumination system can also encompass various types of optical components, including refractive, reflective, and catadioptric optical components for directing, shaping, or controlling the beam of radiation, and such components can also be referred to below, collectively or singularly, as a "lens."

The lithographic apparatus can be of a type having two (e.g., dual stage) or more substrate tables (and/or two or more mask tables). In such "multiple stage" machines the additional tables can be used in parallel, or preparatory steps can be carried out on one or more tables while one or more other tables are being used for exposure.

The lithographic apparatus can also be of a type wherein the substrate is immersed in a liquid having a relatively high refractive index (e.g., water), so as to fill a space between the final element of the projection system and the substrate. Immersion liquids can also be applied to other spaces in the lithographic apparatus, for example, between the substrate and the first element of the projection system. Immersion techniques are well known in the art for increasing the numerical aperture of projection systems.

Further, the apparatus can be provided with a fluid processing cell to allow interactions between a fluid and irradiated parts of the substrate (e.g., to selectively attach chemicals to the substrate or to selectively modify the surface structure of the substrate).

Lithographic Projection Apparatus

Figure 1:
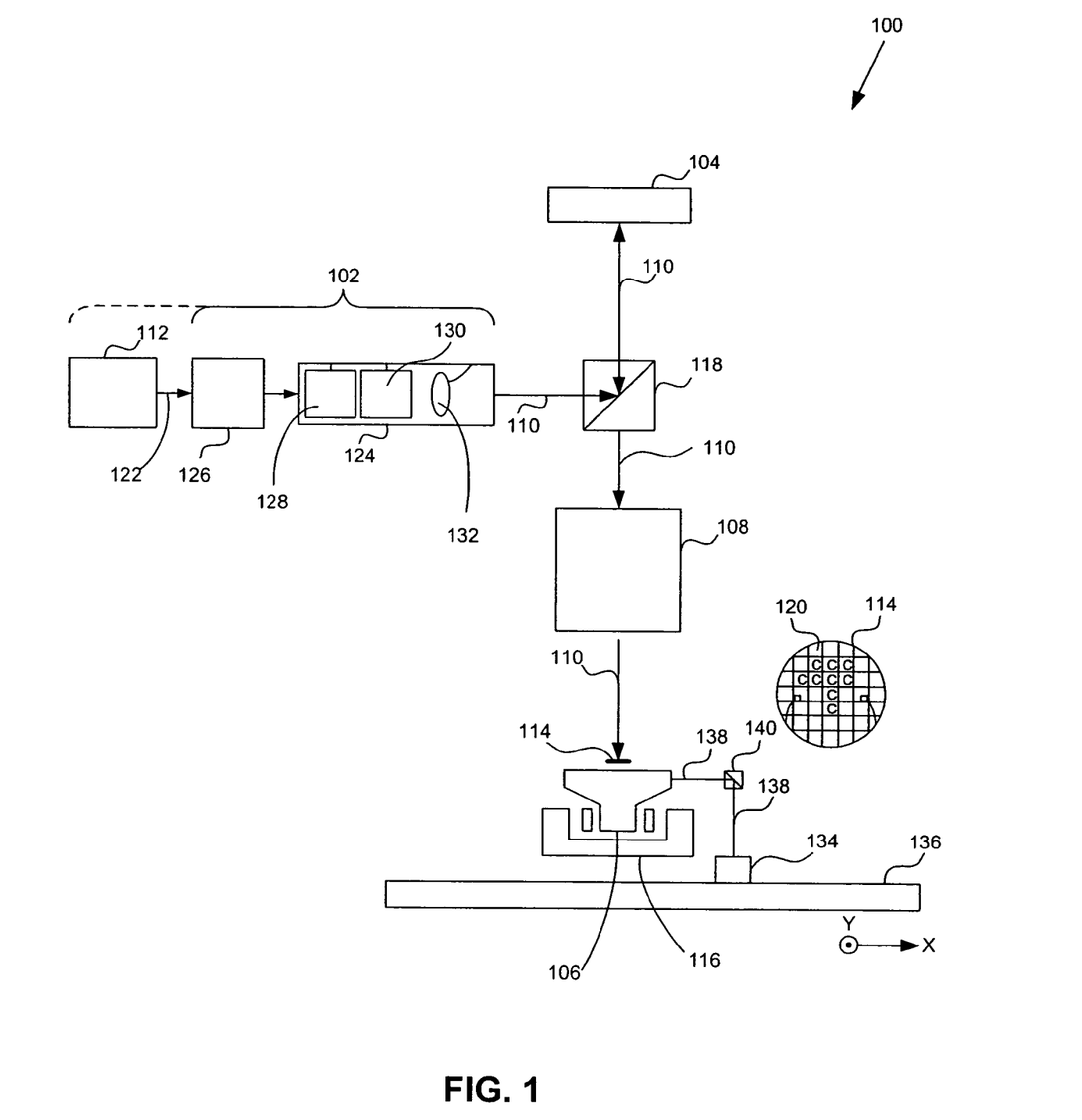
FIG. 1 depicts a lithographic apparatus, according to one embodiment of the present invention.

FIG. 1 schematically depicts a lithographic projection apparatus 100 according to an embodiment of the invention. Apparatus 100 includes at least a radiation system 102, an array of individually controllable elements 104, an object table 106 (e.g., a substrate table), and a projection system ("lens") 108.

Radiation system 102 can be used for supplying a beam 110 of radiation (e.g., UV radiation), which in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 can be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for accurately positioning substrate 114 with respect to projection system 108.

Projection system 108 (e.g., a quartz and/or $CaF_2$ lens system or a catadioptric system comprising lens elements made from such materials, or a mirror system) can be used for projecting the patterned beam received from a beam splitter 118 onto a target portion 120 (e.g., one or more dies) of substrate 114. Projection system 108 can project an image of the array of individually controllable elements 104 onto substrate 114. Alternatively, projection system 108 can project images of secondary sources for which the elements of the array of individually controllable elements 104 act as shutters. Projection system 108 can also comprise a micro lens array (MLA) to form the secondary sources and to project microspots onto substrate 114.

Source 112 (e.g., an excimer laser) can produce a beam of radiation 122. Beam 122 is fed into an illumination system (illuminator) 124, either directly or after having traversed conditioning device 126, such as a beam expander, for example. Illuminator 124 can comprise an adjusting device 128 for setting the outer and/or inner radial extent (commonly referred to as σ-outer and σ-inner, respectively) of the intensity distribution in beam 122. In addition, illuminator 124 will generally include various other components, such as an integrator 130 and a condenser 132. In this way, beam 110 impinging on the array of individually controllable elements 104 has a desired uniformity and intensity distribution in its cross section.

It should be noted, with regard to FIG. 1, that source 112 can be within the housing of lithographic projection apparatus 100 (as is often the case when source 112 is a mercury lamp, for example). In alternative embodiments, source 112 can also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

Beam 110 subsequently intercepts the array of individually controllable elements 104 after being directed using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 6 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system can also be used to position the array of individually controllable elements 104. It will be appreciated that beam 110 can alternatively/additionally be moveable, while object table 106 and/or the array of individually controllable elements 104 can have a fixed position to provide the required relative movement.

In an alternative configuration of the embodiment, substrate table 106 can be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 110. Alternatively, substrate 114 can be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 can be used to project a patterned beam 110 for use in resistless lithography.

The depicted apparatus 100 can be used in four preferred modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned beam 110 scans across substrate 114 and exposes it.

Combinations and/or variations on the above described modes of use or entirely different modes of use can also be employed.

Exemplary Projection Systems

FIGS. 2A, 2B, 3A, 3B, 3C, 4A, 4B, 5A, 5B, 6A and 6B show projection systems, according to various embodiments of the present invention.

Figure 2A:
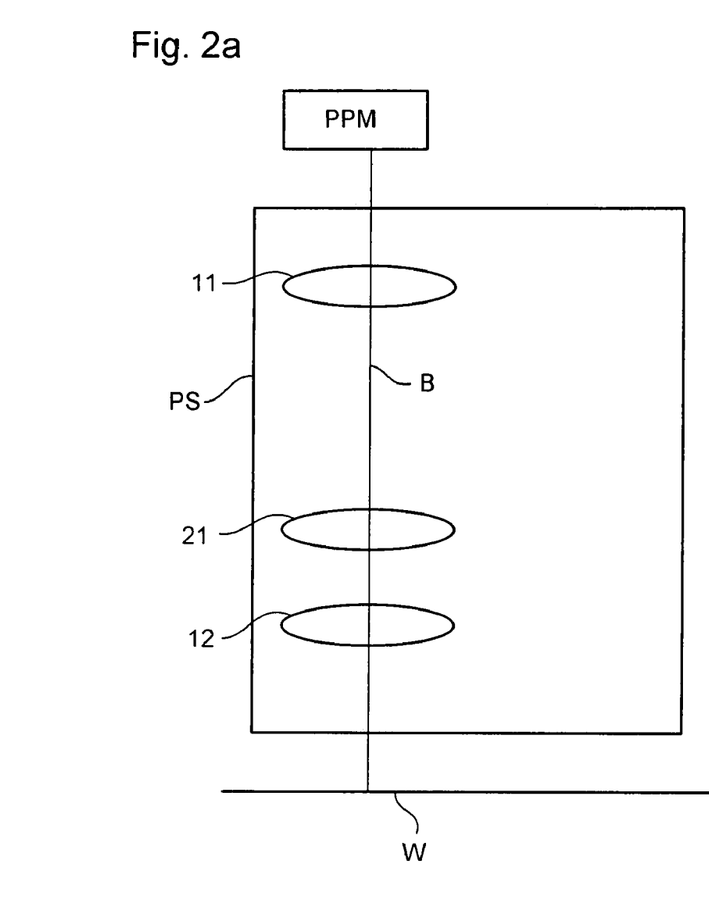
FIGS. 2A and 2B depict a projection system, according to one embodiment of the present invention.
Figure 2B:
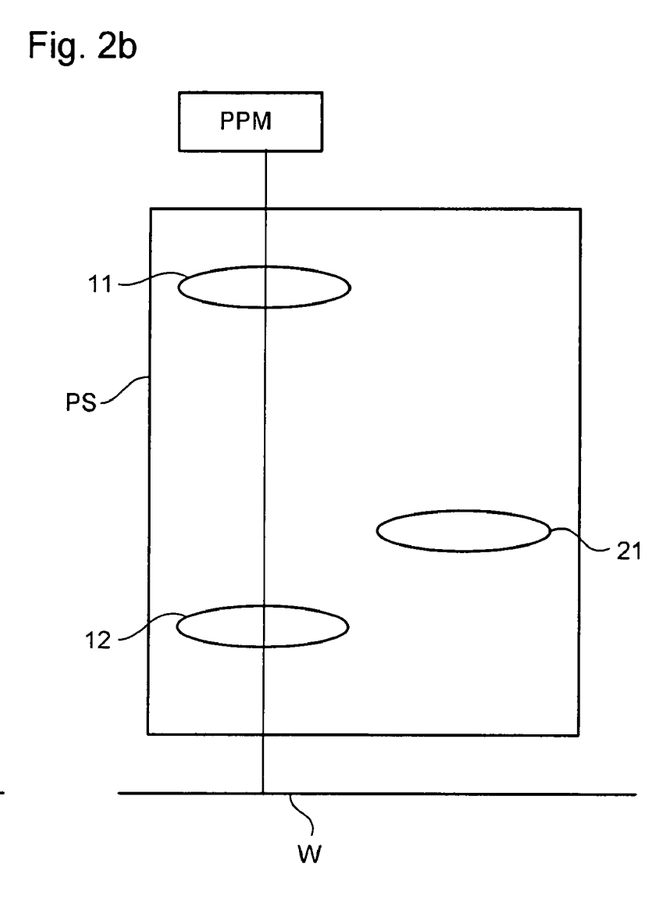

As can be seen in FIGS. 2A and 2B, a projection system PS comprises a plurality of optical elements, 11, 21, 12. In particular, the projection system PS comprises a movable lens, which can be placed in or out of the path of the radiation beam B. In this example, the optical elements are lenses, in particular convex lenses, but could also be concave lenses, mirrors, or any other optical element.

In FIG. 2A, the radiation beam B is projected through all the optical elements 11, 21, 12. The projection system PS, can, for example, de-magnify the radiation beam B by a factor of 8.

FIG. 2B shows when another part of the substrate is being exposed, which has a larger minimum feature size. For example, it can be twice the minimum feature size of the original exposure. In this case, less resolution is required in the image and optical element 21 is removed from the path of the projection beam. The projection system PS de-magnifies the radiation beam B by a factor of 4. In this example, optical element 21 changes the magnification by a factor of 2. However, it is to be appreciated that an optical element changing the magnification by a different factor could also be used.

In one example, the change in the arrangement of lenses in the projection system results in a significant change in the magnification of the radiation beam B. For example, a change of magnification by a factor of 2, 3, 4, 5 or more.

In one example, with optical element 21 removed from the path of the radiation beam B, the area exposed per pixel is four times as large. Hence, the total area exposed in a single exposure. The throughput of the lithographic apparatus is therefore higher. Because the maximum pixel size for the minimum feature for this part of the substrate is being used, the lithographic apparatus is operating at maximum efficiency for this minimum feature size. The magnification of the projection system PS is thus changed according to the resolution required.

When higher resolutions are required, for example for DRAM applications, optical element 21 can be reinserted into the path of the radiation beam B. At higher resolutions a greater number of exposure steps can be required. In various examples, the magnification can be changed between substrates, between dies, or at any time necessary.

Furthermore, as the technology for individually controllable elements continues to develop, the pixel size of the individually controllable elements can decrease as the ability to use projection systems of different magnifications will improve the versatility of lithographic apparatus.

In one example, when another area of the substrate with a smaller minimum feature size needs to be exposed, optical element 21 is again moved into the path of the radiation beam PB. It can either be moved into the projection beam to be against a hard mechanical end stop to ensure that it is correctly positioned in the radiation beam or there can be closed-loop servo control for at least one of X, Y, Z, rotX, rotY, and/or rotZ directions.

In one example, an interferometer can be used to verify the position of lenses for optimum adjustment and also to verify low aberrations. In one example, a control loop can be used to fine tune the location of the lenses.

Figure 3A:
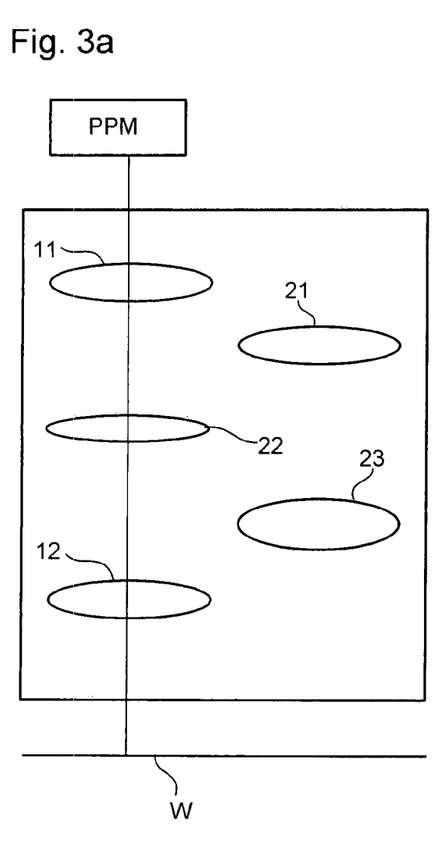
FIGS. 3A to 3C depict a projection system, according to one embodiment of the present invention.
Figure 3B:
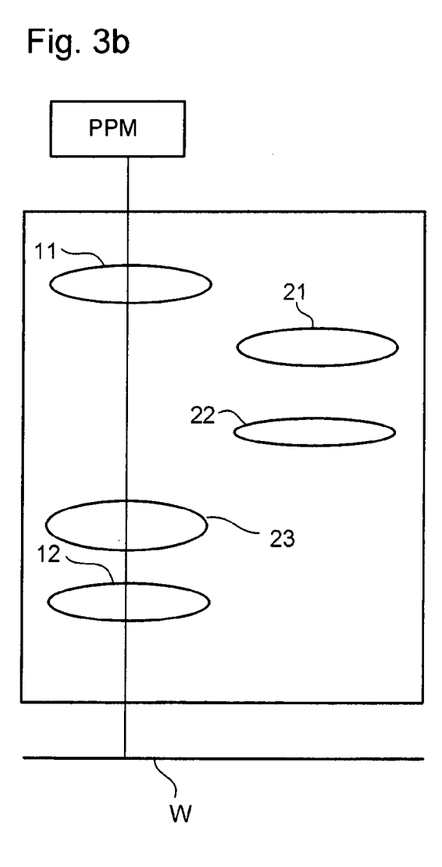
Figure 3C:
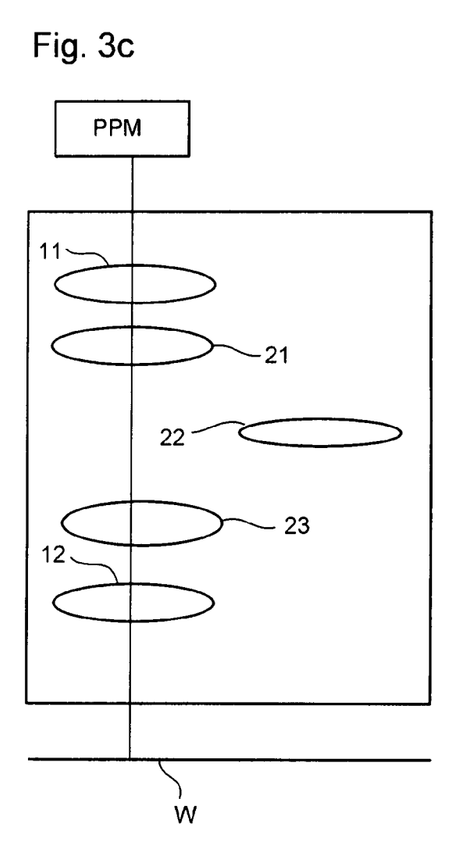

FIGS. 3A, 3B, and 3C show another embodiment, in which there are a plurality of movable lenses, each of which can be placed in or out of the path of the radiation beam. As shown in FIGS. 3A, 3B and 3C, there can be a plurality of movable lenses, 21, 22, 23. Each moveable lens, 21, 22, 23 has a different magnification, so when each lens is placed in the path of the radiation beam B the projection system has a different de-magnification. FIG. 3A shows lens 22 in the path of the radiation beam B and FIG. 3B shows lens 23 in the path of the radiation beam B. Furthermore, a combination of the moveable lenses can be placed in the path of the radiation beam B as shown in FIG. 3C, in which lenses 21 and 23 are both placed in the path of the radiation B. In each of these scenarios, the projection system PS has a different magnification.

Such a plurality of lenses of different magnifications means that the projection system PS can have a wide variety of different magnifications.

Figure 4A:
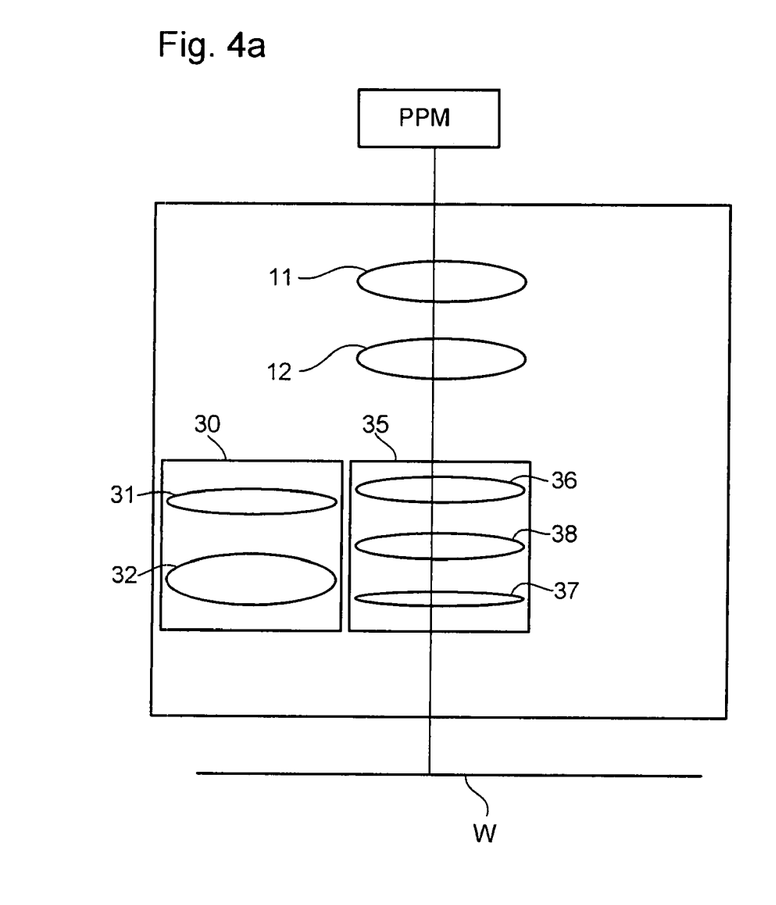
FIGS. 4A and 4B depict a projection system, according to one embodiment of the present invention.
Figure 4B:
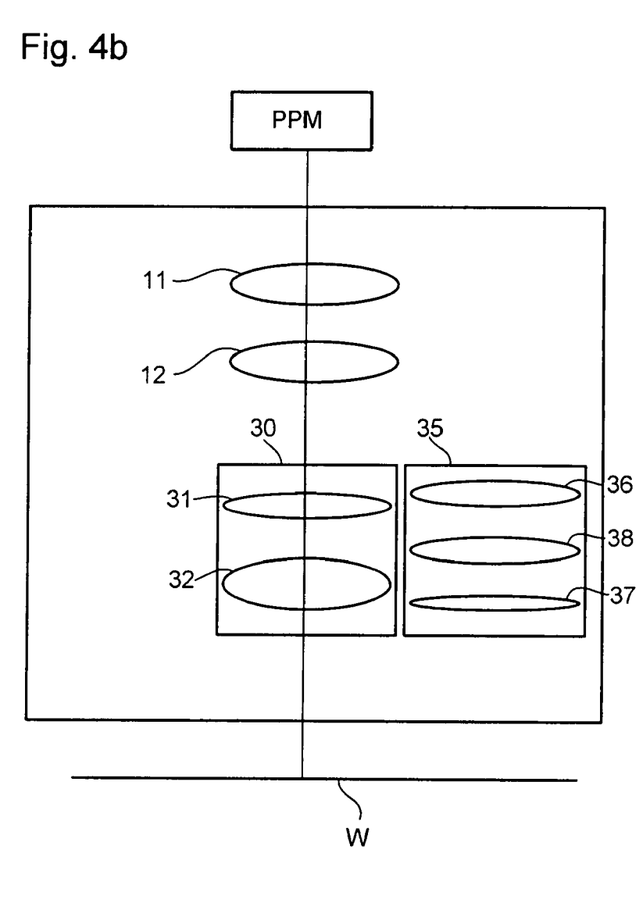

The embodiment shown in FIGS. 4A and 4B, the projection system comprises a plurality of groups of lenses, any of which can be moved into the path of the radiation beam B.

FIG. 4A shows a first group of movable lenses 30 comprising lenses 31 and 32 and a second group of lenses 35 comprising lenses 36, 37 and 38. Each group of lenses can comprise any number of lenses and even just one lens. The lenses within a lens group can be at any position relative to each other but are fixed in that the position relative to the other lenses in the lens group.

FIG. 4B shows the second lens group 35 in the path of the projection beam. In one example, when a different part of the substrate requiring a different magnification is exposed, the second group of lenses 35 is moved out of the path of the projection beam and the first group of lenses 30 is moved into the path of the projection beam. This can be by a mechanical end stop mechanism, for example a sliding mechanism, a revolving mechanism, a ball and groove mechanism, or under servo control for at least one of X, Y, Z, rotX, rotY and/or rotZ directions. In one example, the position of the groups of lenses can be verified with an interferometer. It is particularly important to ensure that the lens group in the path of the projection beam is correctly positioned.

Although this example depicts just two groups of lenses 30, 35 there can be any number of lens groups.

Figure 5A:
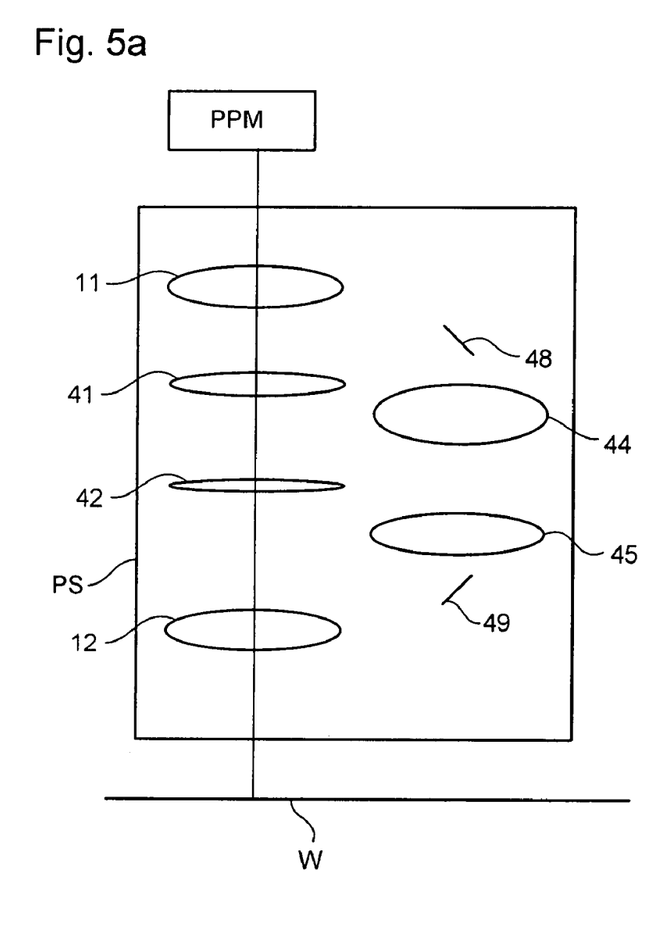
FIGS. 5A and 5B depict a projection system, according to one embodiment of the present invention.
Figure 5B:
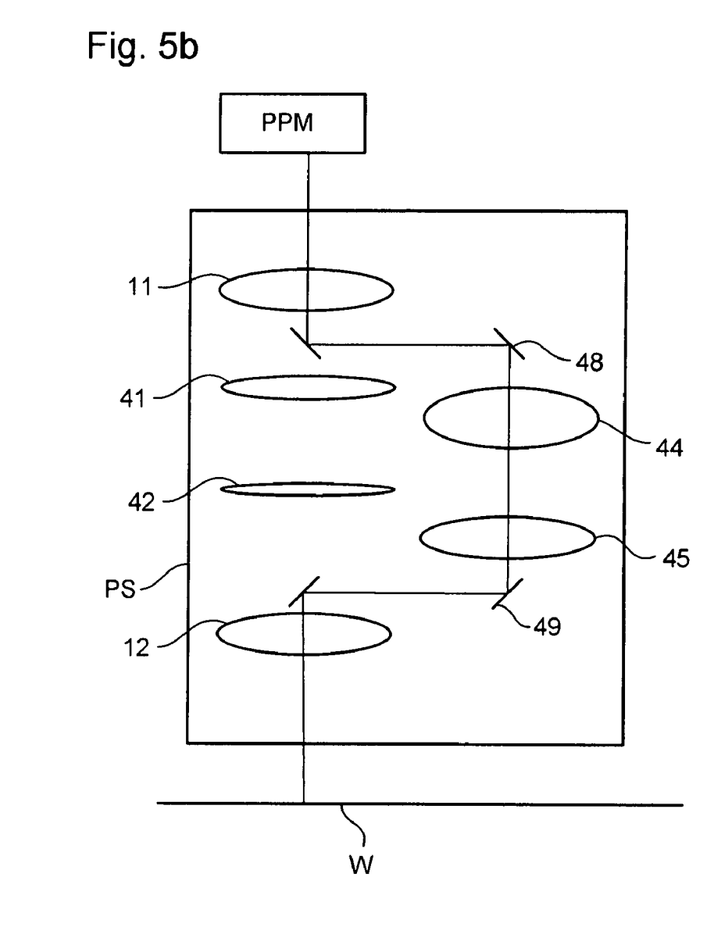

In the embodiment shown in FIGS. 5A and 5B, the projection system can comprise a plurality of possible routes for the radiation beam B, each route having a different magnification. In one example, the projection system further comprises a plurality of mirrors for changing which of the different routes the radiation beam takes.

FIG. 5A shows radiation beam B being projected through lenses 11, 41, 42 and 12. In FIG. 5B mirrors 46 and 48 have been placed in the path of the projection beam to project the radiation beam B through a second group in the projection system PS. The second route comprises lenses 44 and 45 having a different magnification from lenses 41 and 42. The position and strength of lenses 41, 42, 44 and 45 is such that the focal point of the projection system remains unchanged. Mirrors 47 and 49 project the radiation beam B back towards lens 12 to be projected through the rest of the projection system. The projection system PS has a different magnification according to the route taken by the radiation beam B within the projection system PS.

Although mirrors 46, 47, 48 and 49 have been used in this example, other deflecting elements, e.g., prisms, could also be used. The mirrors can be moved into and out of the path of the projection system and their position accurately controlled using a mechanical end stop or using servo control.

Although in this example both optical routes comprised two lenses 41 and 42 and 44 and 45, each route can comprise any number of optical elements. Indeed there can be no additional optical elements in a particular route.

Figure 6A:
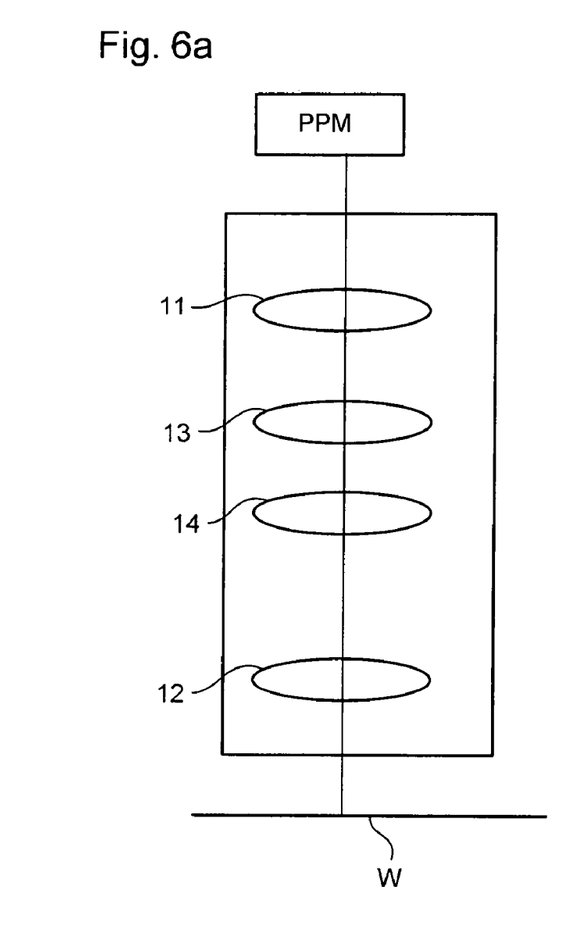
FIGS. 6A and 6B depict a projection system, according to one embodiment of the present invention.
Figure 6B:
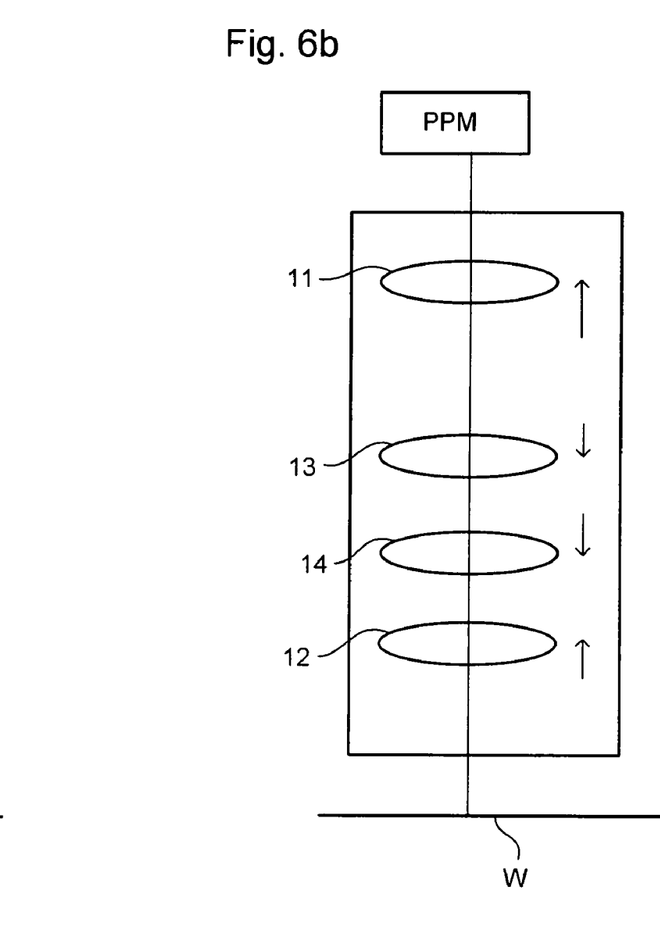

In the embodiment shown in FIGS. 6A and 6B, the projection system PS comprises movable lenses. The position of the lenses within the path of the radiation beam is variable.

In FIG. 6A, lenses 11, 12, 13, 14 are shown in first positions. In FIG. 6B, lenses 11, 12, 13, 14 are shown in second positions. Lenses 11 and 12 have been moved towards the individually controllable elements and lenses 13 and 14 have been moved towards a substrate W. However, the lenses have only moved parallel to the path of the radiation beam. Lenses 11, 12, 13 and 14 can be on a track to ensure that they move only parallel to the path of the radiation beam B. In this example there is servo control of at least one of the X, Y, Z, rotX, rotY and/or rotZ axes. In one example, there is also servo control of other axes.

The different positions of lenses 11, 12, 13, 14 result in the projection system having a different de-magnification factor.

This configuration can result in higher aberrations so is more suitable for use with lower resolutions.

In one example, a projection system can be arranged in two parts: one part with a fixed magnification arranged close to a substrate and another part with variable magnification arranged further from the substrate. The total magnification can be between 50 to 1000 times.

Figure 7:
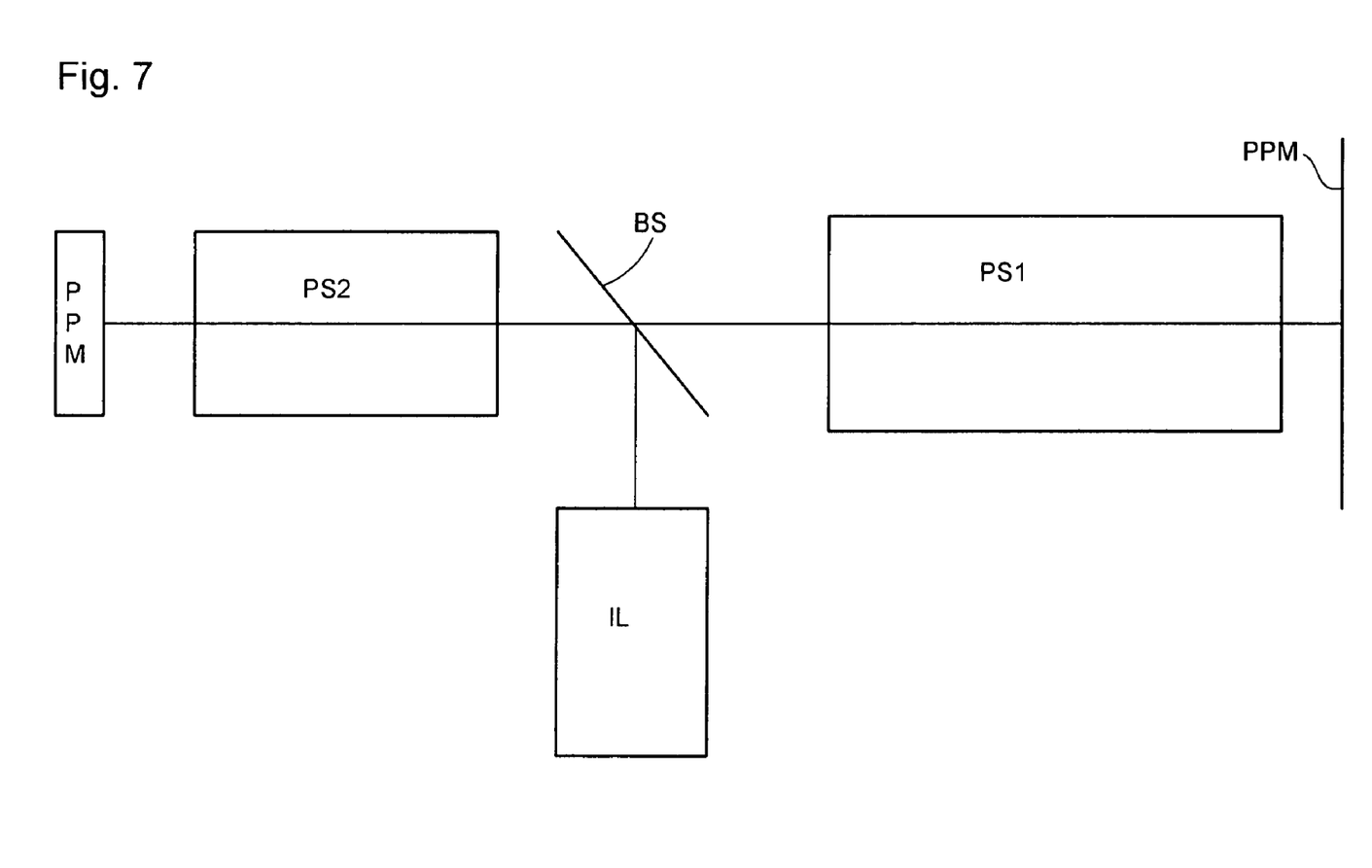
FIG. 7 shows an arrangement for an illumination used with a variable magnification projection system depict a projection system, according to one embodiment of the present invention.

FIG. 7 shows a projection system, according to one embodiment of the present invention. Changing the magnification of the projection system PS changes a numerical aperture (NA). However, it is desirable to keep the NA approximately constant so the magnification of the illuminating beam of radiation must be changed also. This can be accomplished by the apparatus shown in FIG. 7, in which the projection system is split into two parts, PS1 and PS2. PS1 has a fixed magnification and PS2 has a variable magnification (described above). The variably part of the projection system PS2 also operates as part of an illumination system. A radiation beam is projected from an illuminator, reflected by a beam splitting device, and through the variable magnification part of the projection system PS2. After reflection by individually controllable elements, the radiation beam is projected back through the variable part of the projection system PS2. Thus, when the magnification of the projection optics is changed, the magnification of the illumination optics is correspondingly changed. The radiation beam is then projected back through the beam splitting device, the fixed magnification part of the projection system PS1 and onto a substrate. When the magnification of the projection optics is changed the magnification of the illuminating optics is thus changed correspondingly. Alternatively, the magnification within the illuminator itself is changed. However, this can be more complex as the telecentricity of the beam must remain constant.

While specific embodiments of the invention have been described above, it will be appreciated that the invention can be practiced otherwise than as described. For example, the invention can take the form of a computer program containing one or more sequences of machine-readable instructions describing a method as disclosed above, or a data storage medium (e.g., semiconductor memory, magnetic or optical disk) having such a computer program stored therein.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all, exemplary embodiments of the present invention as contemplated by the inventor(s), and thus, are not intended to limit the present invention and the appended claims in any way.

What is claimed is:

1. A lithographic apparatus comprising:
an illumination system that conditions a radiation beam;
an array of individually controllable elements that pattern the beam; and
a projection system that projects the patterned beam onto a target portion of a substrate, wherein the projection system can project the radiation beam at a plurality of different magnifications less than 50%.

2. The apparatus of claim 1, wherein the projection system comprises:
   a moveable lens that can be placed in or out of the path of the radiation beam.

3. The apparatus of claim 2, wherein the projection system further comprises:
   a plurality of the movable lenses that are moved into or out of the path of the patterned beam.

4. The apparatus of claim 1, wherein the projection system comprises:
   a plurality of groups of lenses that are moved into or out of the path of the radiation beam.

5. The apparatus of claim 1, wherein the projection system comprises:
   a plurality of alternative light paths for the patterned beam, each of the plurality of alternative light paths having a different magnification.

6. The apparatus of claim 5, wherein the projection system comprises:
   a plurality of mirrors for changing which of the plurality of alternative light paths the patterned beam is directed through.

7. The apparatus of claim 1, wherein the projection system comprises:
   moveable lenses, wherein relative positions of the moveable lenses within a path of the patterned beam is variable.

8. The apparatus of claim 1, wherein the illumination system operates at a plurality of different magnifications.

9. A system, comprising:
   a pattern generator that patterns a beam of radiation produced by an illumination system; and
   a transferring device that transfers the patterned beam onto a substrate and projects the patterned beam at a plurality of significantly different magnifications less than 50%.

10. The system of claim 9, wherein the illumination system operates at a plurality of different magnifications.

11. A lithographic apparatus, comprising:
   an illumination system that conditions a radiation beam;
   an array of individually controllable elements that pattern the beam; and
   a projection system that projects the patterned radiation beam onto a target portion of a substrate at a first magnification, wherein the projection system projects the patterned beam onto another target portion of the substrate at a second magnification, the second magnification being substantially 1/n, wherein n is any positive integer greater than two.

12. A device manufacturing method, comprising:
   using an array of individually controllable elements to pattern a radiation beam;
   projecting the patterned beam of radiation at a first magnification onto a target portion of a substrate; and
   projecting the patterned beam of radiation at the second magnification onto another target portion of the substrate, wherein the second magnification is significantly different from the first magnification and less than 50%.

* * * * *